(12) United States Patent
Wang

(10) Patent No.: US 10,964,823 B2
(45) Date of Patent: Mar. 30, 2021

(54) SEMICONDUCTOR STRUCTURE AND METHOD FOR FORMING SAME

(71) Applicants: Semiconductor Manufacturing International (Beijing) Corporation, Beijing (CN); Semiconductor Manufacturing International (Shanghai) Corporation, Shanghai (CN)

(72) Inventor: Nan Wang, Shanghai (CN)

(73) Assignees: Semiconductor Manufacturing (Beijing) International Corporation, Beijing (CN); Semiconductor Manufacturing (Shanghai) International Corporation, Shanghai (CN)

( * ) Notice: Subject to any disclaimer, the term of this patent is extended or adjusted under 35 U.S.C. 154(b) by 0 days.

(21) Appl. No.: 16/424,938

(22) Filed: May 29, 2019

(65) Prior Publication Data
US 2020/0058800 A1    Feb. 20, 2020

(30) Foreign Application Priority Data
Aug. 14, 2018   (CN) .......................... 201810920760.2

(51) Int. Cl.
| | |
|---|---|
| H01L 29/786 | (2006.01) |
| H01L 29/78 | (2006.01) |
| H01L 29/66 | (2006.01) |
| H01L 21/02 | (2006.01) |
| H01L 29/423 | (2006.01) |

(52) U.S. Cl.
CPC .. H01L 29/78696 (2013.01); H01L 21/02636 (2013.01); H01L 29/42392 (2013.01); H01L 29/66545 (2013.01); H01L 29/66795 (2013.01); H01L 29/785 (2013.01)

(58) Field of Classification Search
CPC ......... H01L 29/66795; H01L 29/78642; H01L 27/0886; H01L 27/0924; H01L 21/823431; H01L 21/823487; H01L 21/823821
See application file for complete search history.

(56) References Cited

U.S. PATENT DOCUMENTS

2019/0355724 A1 * 11/2019 Chiang ............ H01L 21/02356

* cited by examiner

*Primary Examiner* — Hsien Ming Lee
(74) *Attorney, Agent, or Firm* — Brinks Gilson & Lione

(57) ABSTRACT

A semiconductor structure and a method for forming same are provided. One form of the method includes: providing a substrate including a device unit area, where at least two fins are formed on the substrate, a channel structure layer is formed on the fins, which includes a first channel structure layer located on at least one fin, a second channel structure layer located on at least one fin, and a third channel structure layer located on at least one fin, the first channel structure layer includes multiple channel laminates, each channel laminate includes a first sacrificial layer and a first channel layer; forming a dummy gate structure across the channel structure layer; forming a source-drain doping layer on two sides of the dummy gate structure; and forming a gate structure at positions of the dummy gate structure and the first sacrificial layer.

17 Claims, 7 Drawing Sheets

SEMICONDUCTOR STRUCTURE AND METHOD FOR FORMING SAME

RELATED APPLICATIONS

The present application claims priority to Chinese Patent Appln. No. 201810920760.2, filed Aug. 14, 2018, the entire disclosure of which is hereby incorporated by reference.

BACKGROUND

Technical Field

Embodiments and implementations of the present disclosure relate to the field of semiconductor manufacturing, and in particular, to a semiconductor structure and a method for forming same.

Related Art

With the rapid development of semiconductor manufacturing technology, semiconductor devices are developed to have a higher element density and a higher integration level. Semiconductor process nodes are continually becoming smaller following the development trend of the Moore's law. Transistors are widely applied and are currently the most fundamental semiconductor devices. Therefore, as the element density and the integration level of the semiconductor devices are improved, a channel length of transistors has to be reduced to adapt to the smaller process nodes.

The decrease in the transistor channel length achieves advantages such as increasing a die density of a chip and improving a switching speed. However, as the channel length decreases, a distance between the source and the drain of the transistor also decreases. Therefore, a channel controlling capability of the gate is deteriorated. As a result, a subthreshold leakage phenomenon, that is, the so-called short-channel effects (SCE), occurs more easily, causing a channel leakage current of the transistor to increase.

Therefore, in order to better meet the requirement of proportional reduction of a device size, the semiconductor process gradually transits from a planar transistor to a three-dimensional transistor with higher efficacy, such as a gate-all-around (GAA) transistor. In the GAA transistor, the gate surrounds a channel region from all directions. Compared with the planar transistor, the gate of the GAA transistor has a stronger channel controlling capability and can better suppress the SCE.

SUMMARY

A problem to be addressed by the embodiments and implementations of the present disclosure is to provide a semiconductor structure and a method for forming same, so as to improve device performance.

In order to address the foregoing problem, one form of the present disclosure provides a method for forming a semiconductor structure. The method may include: providing a substrate, the substrate including a device unit area, where at least two fins are formed on the substrate of the device unit area, a channel structure layer is formed on the fins, the channel structure layer includes a first channel structure layer located on at least one fin and a second channel structure layer located on at least one fin, the first channel structure layer includes multiple channel laminates, each channel laminate includes a first sacrificial layer and a first channel layer located on the first sacrificial layer, and the second channel structure layer is a second channel layer of a single-layer structure; forming a dummy gate structure across the channel structure layer of the device unit area, where the dummy gate structure covers a part of the top and a part of lateral sides of the channel structure layer; forming a source-drain doping layer in the channel structure layer on two sides of the dummy gate structure; after forming the source-drain doping layer, forming an interlayer dielectric layer on the substrate exposed by the dummy gate structure, where the interlayer dielectric layer covers lateral sides of the dummy gate structure; and after forming the interlayer dielectric layer, forming a gate structure at positions of the dummy gate structure and the first sacrificial layer.

Another form of the present disclosure provides a semiconductor structure. The semiconductot structure may include: a substrate, where the substrate includes a device unit area, and at least two fins are formed on the substrate of the device unit area; a channel structure located on the fins, where the channel structure includes a first channel structure located on at least one fin and a second channel structure located on at least one fin, the first channel structure is spaced apart from the fin and includes multiple first channel layers spaced apart, and the second channel structure is a second channel layer of a single-layer structure; a gate structure across the channel structure, where the gate structure covers a part of the top and a part of lateral sides of the channel structure and surrounds the first channel layers; and a source-drain doping layer penetrating through the channel structure on two sides of the gate structure.

Compared with the prior art, technical solutions of embodiments and implementations of the present disclosure have the following advantages:

In embodiments and implementations of the present disclosure, a channel structure layer is formed on fins, where the channel structure layer includes a first channel structure layer located on at least one fin and a second channel structure layer located on at least one fin. The first channel structure layer includes multiple channel laminates, each channel laminate includes a first sacrificial layer and a first channel layer located on the first sacrificial layer, and the second channel structure layer is a second channel layer of a single-layer structure. The first channel structure layer is formed, so that a channel controlling capability of the subsequently formed gate structure can be improved, thereby alleviating short-channel effects of a device. The second channel structure layer is formed, so that a self-heating effect of the device can be alleviated. In summary, by integrating a GAA transistor and a fin-type field effect transistor into one device unit area, embodiments and implementations of the present disclosure alleviate the self-heating effect while improving the channel controlling capability of the gate structure, so that overall performance of the device can be improved.

In some implementations, the channel structure layer further includes a third channel structure layer located on at least one fin. The third channel structure layer includes a third channel layer, a second sacrificial layer located on the third channel layer, and a fourth channel layer located on the second sacrificial layer. By using the third channel structure, the formed device has properties of both the GAA transistor and the fin-type field effect transistor, so that the short-channel effects and the self-heating effect of the device can be further balanced, thereby further improving the overall performance of the device.

DETAILED DESCRIPTION

It can be learned from the background art that it is desirable to improve a performance of current GAA transistors. Discussed below are reasons why a device performance of GAA transistors still need to be improved is analyzed with reference to a semiconductor structure.

Figure 1:
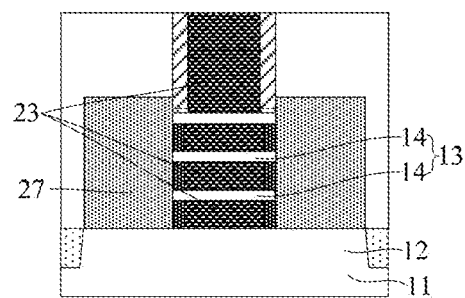
FIG. 1 is a schematic structural diagram of a semiconductor structure.

Referring to FIG. 1, FIG. 1 shows a schematic structural diagram of a semiconductor structure.

The semiconductor structure includes: a substrate 11; a fin 12 protruding from the surface of the substrate 11; a channel structure 13, located on the fin 12 and spaced apart from the fin 12, where the channel structure 13 includes multiple channel layers 14 spaced apart; a gate structure 23 across the channel structure 13, where the gate structure 23 covers a part of the top of the fin 12 and surrounds the channel layers 14; and a source-drain doping layer 27, located in the channel structure 13 on two sides of the gate structure 23 and in contact with the fin 12.

Compared with a fin-type field effect transistor, the channel layer 14 of the GAA transistor is surrounded by the gate structure 23, where the gate structure 23 is generally a metal gate structure, that is, the gate structure 23 generally includes a high k gate dielectric layer and a gate electrode layer located on the high k gate dielectric layer. The channel layer 14 and the substrate 11 are isolated from each other by the high k gate dielectric layer, and a material of the high k gate dielectric layer has a relatively low thermal conductivity coefficient. Therefore, heat generated during working of the device can hardly be dissipated through the substrate 11. As a result, the heat generated during working of the device is easily dissipated through the source-drain doping layer 27. This not only deteriorates a self-eating effect of the device, but also correspondingly deteriorates short-channel effects, thereby decreasing overall performance of the device.

In order to address the technical problem, in embodiments and implementations of the present disclosure, a channel structure layer is formed on fins, where the channel structure layer includes a first channel structure layer located on at least one fin and a second channel structure layer located on at least one fin, the first channel structure layer includes multiple channel laminates, each channel laminate includes a first sacrificial layer and a first channel layer located on the sacrificial layer, and the second channel structure layer is a second channel layer of a single-layer structure. By integrating a GAA transistor and a fin-type field effect transistor into one device unit area, the self-heating effect is alleviated while the channel controlling capability of the gate structure is improved, so that the overall performance of the device can be improved.

To make the foregoing objectives, features and advantages of the embodiments and implementations of the present disclosure easier to understand, the specific embodiments and implementations of the present disclosure are described in detail below with reference to the accompanying drawings.

FIG. 2 to FIG. 19 are schematic structural diagrams corresponding to steps in one implementation of a method for forming a semiconductor structure.

Figure 2:
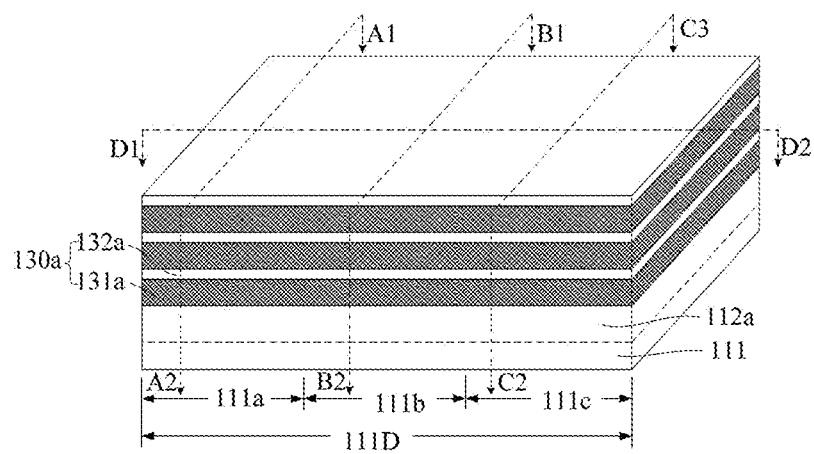
FIG. 2 to FIG. 19 are schematic structural diagrams corresponding to steps in one implementation of a method for forming a semiconductor structure.
Figure 3:
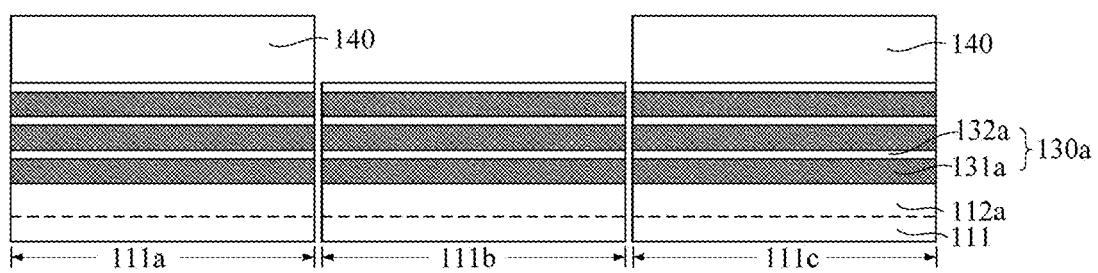
Figure 4:
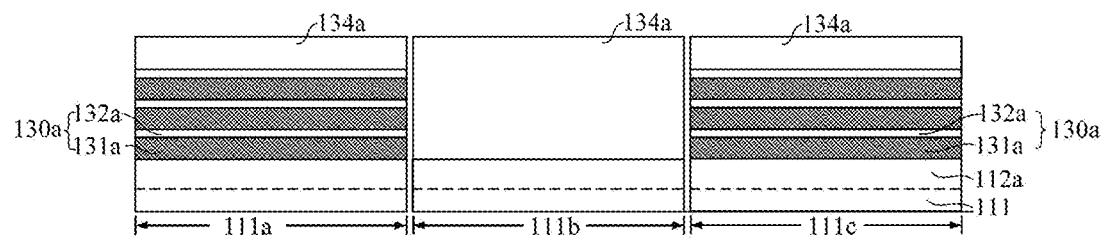
Figure 5:
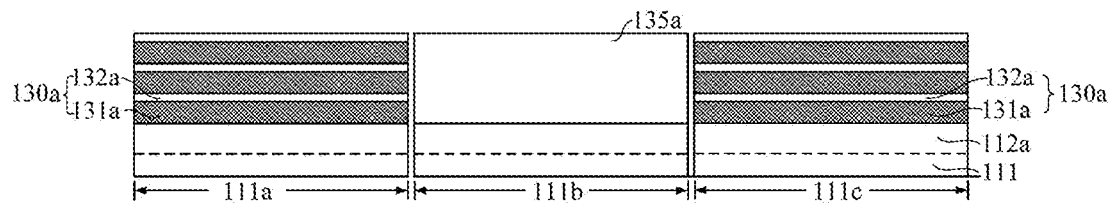
Figure 6:
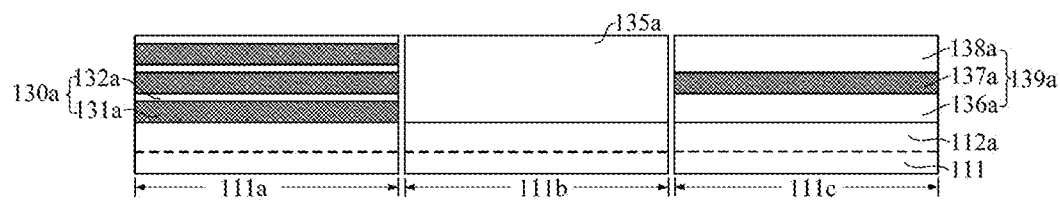
Figure 7:
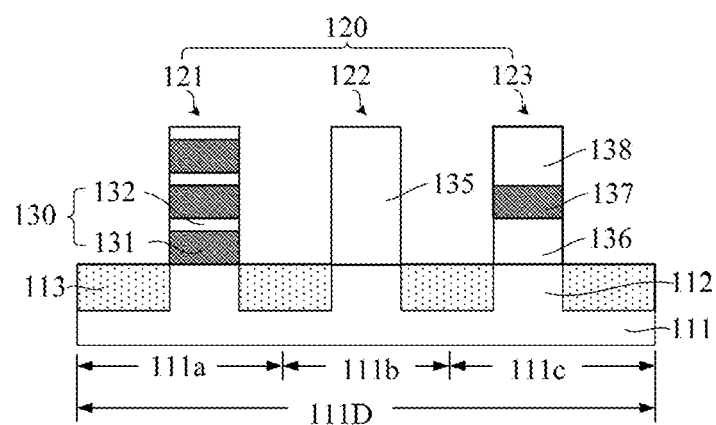
Figure 8:
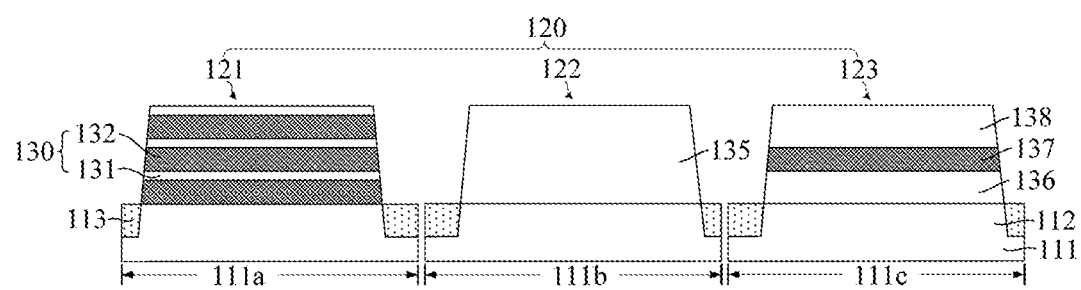

With reference to FIG. 2 to FIG. 8 in combination, FIG. 2 is a three-dimensional diagram; FIG. 3 shows cross-sectional views of FIG. 2 along cut lines A1A2, B1B2 and C1C2 respectively; FIG. 4 is a cross-sectional view based on FIG. 3; FIG. 5 is a cross-sectional view based on FIG. 4; FIG. 6 is a cross-sectional view based on FIG. 5; FIG. 7 is a cross-sectional view along a cut line perpendicular to a fin extension direction based on FIG. 6; FIG. 8 shows cross-sectional views, along a cut line in the fin extension direction, of FIG. 7 at positions of a first region 111a, a second region 111b and a third region 111c respectively. A substrate 111 (as shown in FIG. 7 or FIG. 8) is provided. The substrate 111 includes a device unit area 111D (as shown in FIG. 2 or FIG. 7). At least two fins 112 (as shown in FIG. 7 or FIG. 8) are formed on the substrate 111 of the device unit area 111D. A channel structure layer 120 (as shown in FIG. 7 or FIG. 8) is formed on the fins 112. The channel structure layer 120 includes a first channel structure layer 121 (as shown in FIG. 7 or FIG. 8) located on at least one fin 112 and a second channel structure layer 122 (as shown in FIG. 7 or FIG. 8) located on at least one fin 112. The first channel structure layer 121 includes multiple channel laminates 130 (as shown in FIG. 7 or FIG. 8). Each channel laminate 130 includes a first sacrificial layer 131 (as shown in FIG. 7 or FIG. 8) and a first channel layer 132 (as shown in FIG. 7 or FIG. 8) located on the first sacrificial layer 131. The second channel structure layer 122 is a second channel layer 135 (as shown in FIG. 7 or FIG. 8) of a single-layer structure.

In some implementations, the substrate 111 is a silicon substrate. In other implementations, the material of the substrate may also be germanium, silicon germanide, silicon carbide, gallium arsenide, indium arsenide or the like. The substrate may also be other types of substrates such as a silicon substrate on an insulator or a germanium substrate on an insulator. The material of the substrate may also be a material meeting the process requirements or a material that is easy to integrate.

The fins 112 expose a part of the substrate 111, so as to provide a process foundation for forming an isolation structure subsequently. In some implementations, the fins 112 and the substrate 111 are of an integrated structure. In other implementations, the fins may also be a semiconductor layer epitaxially grown on the substrate, thereby achieving an objective of controlling the height of the fins precisely.

Therefore, in this implementation, a material of the fins 112 is the same as the material of the substrate 111. The material of the fins 112 is silicon. In other implementations, the material of the fins may also be a semiconductor material suitable for forming the fins, such as germanium, silicon germanide, silicon carbide, gallium arsenide or indium arsenide. The material of the fins may also be different from the material of the substrate.

The first sacrificial layer 131 is used for supporting the first channel layer 132, thereby providing a process foundation for arranging the first channel layers 132 at intervals in a suspended manner subsequently, and also occupying a spatial position for forming a gate structure subsequently. The first channel layer 132 and the second channel layer 135 are used for providing channels of a formed device. In some implementations, in order to improve process compatibility, a material of the first channel layer 132 is the same as a material of the second channel layer 135.

In some implementations, the materials of the first channel layer 132 and the second channel layer 135 are both Si, and the material of the first sacrificial layer 131 is SiGe. In the subsequent process of removing the first sacrificial layer 131, an etching selectivity ratio between SiGe and Si is relatively high, so that impact on the first channel layer 132 and the second channel layer 135 by the removal process of the first sacrificial layer 131 can be effectively reduced, thereby helping improve device performance. In other implementations, when a PMOS transistor is formed, in order to improve performance of the PMOS transistor, a SiGe channel technology can be used. Correspondingly, the materials of the fins, the first channel layer and the second channel layer may all be SiGe, and the material of the first sacrificial layer is Si.

In some implementations, the substrate 111 is used for forming a high current device. Therefore, at least two fins 112 are formed on the substrate 111 of the device unit area 111D, and when gate structures are formed subsequently, each gate structure crosses the multiple fins 112 of the device unit area 111D. Therefore, by using the first channel layer 132 and the first sacrificial layer 131, the gate structure can cover the first channel layer 132, so that a channel controlling capability of the gate structure is improved. The second channel layer 135 is in contact with the top of the fin 112, so that heat generated subsequently by the device during working can be dissipated through the fin 112 and the substrate 111, thereby alleviating the self-heating effect of the device. In summary, by integrating the structure of a GAA transistor and the structure of a fin-type field effect transistor to one device unit area 111D, some implementations can alleviate the self-heating effect while improving the channel controlling capability of the gate structure, so that overall performance of the device can be improved.

In some implementations, the first channel structure layer 121 including three channel laminates 130 is used as an example for description, that is, the first channel structure layer 121 includes three first sacrificial layers 131 and three first channel layers 132 arranged alternately. In other implementations, according to actual process requirements, the quantity of the channel laminates is not limited to three, and may also be two, four, or the like.

In some implementations, the device unit area 111D includes a first region 111a and a second region 111b. The first region 111a is used for forming the first channel structure layer 121, and the second region 111b is used for forming the second channel structure layer 122. Specifically, the step of forming the fins 112 and the channel structure layer 120 includes: as shown in FIG. 2 to FIG. 5, providing a substrate 111, where a fin material layer 112a is formed on the substrate 111; sequentially forming multiple first channel material laminates 130a on the fin material layer 112a of the first region 111a, where each first channel material laminate 130a includes a first sacrificial material layer 131a and a first channel material layer 132a located on the first sacrificial material layer 131a; forming a second channel material layer 135a (as shown in FIG. 5 or FIG. 6) on the fin material layer 112a of the second region 111b; patterning the first channel material laminates 130a of the first region 111a, the second channel material layer 135a of the second region 111b, and the fin material layer 112a of the first region 111a and the second region 111b, to form fins 112 protruding from the surface of the substrate 111, where the remaining first channel material laminates 130a on the fin 112 of the first region 111a are used as the first channel structure layer 121, and the remaining second channel material layer 135a on the fin 112 of the second region 111b is used as the second channel structure layer 122.

In some implementations, the quantity of the channel laminates 130 is three, and the quantity of the first channel material laminates 130a is correspondingly three.

In some implementations, the first channel material laminates 130a and the second channel material layer 135a are formed on the fin material layer 112a by means of epitaxial growth. Therefore, the first channel material laminates 130a and the second channel material layer 135a have relatively good forming quality, so that channels of the formed device are located in high-quality materials, thus helping improve device performance.

In some implementations, in order to improve the process operability, after the multiple first channel material laminates 130a are sequentially formed on the fin material layer 112a of the first region 111a, the second channel material layer 135a is formed on the fin material layer 112a of the second region 111b. In other implementations, the multiple first channel material laminates may also be sequentially formed on the fin material layer of the first region after the second channel material layer is formed on the fin material layer of the second region.

In some implementations, through a mask, the first channel material laminates 130a and the second channel material layer 135a are selectively formed on different regions by using an etching process and an epitaxial growth process in combination. Specifically, as shown in FIG. 2, the multiple first channel material laminates 130a are formed on the fin material layer 112a; as shown in FIG. 3, a pattern layer 140 covering the first channel material laminates 130a of the first region 111a is formed; etching is performed using the pattern layer 140 as a mask, to remove the multiple first channel material laminates 130a of the second region 111b and expose the fin material layer 112a of the second region 111b; after the multiple first channel material laminates 130a of the second region 111b are removed, the pattern layer 140 (as shown in FIG. 3) is removed; as shown in FIG. 5, after the pattern layer 140 is removed, the second channel material layer 135 is formed on the fin material layer 112a of the second region 111b using an epitaxial growth process.

In some implementations, a material of the pattern layer 140 is a photoresist. After the multiple first channel material laminates 130a of the second region 111b are removed, the pattern layer 140 is removed by means of ashing or wet photoresist stripping. For ease of illustration, FIG. 2 does not show the pattern layer 140.

The epitaxial growth process generally has a relatively high process temperature, by removing the pattern layer 140 before the epitaxial growth process is performed, the pollution caused by volatilization of the photoresist can be avoided.

In some implementations, the step of forming a second channel material layer 135a on the fin material layer 112a of the second region 111b includes: epitaxially growing an initial second channel material layer 134a (as shown in FIG. 4) on the fin material layer 112a of the second region 112a by using a selective epitaxy process, where the top of the initial second channel material layer 134a is higher than the top of the first channel material laminate 130a of the first region 111a; after the selective epitaxy process, performing planarization treatment on the initial second channel material layer 134a, so that the top of the remaining initial second channel material layer 134a is flush with the top of the first channel material laminate 130a, and the remaining initial second channel material layer 134a after the planarization treatment is used as the second channel material layer 135a.

During the epitaxial growth process, the initial second channel material layer 134a is further formed on the surface of the first channel material laminate 130a of the first region 111a. Therefore, the initial second channel material layer 134a of the first region 111a can further be removed through the planarization treatment.

It should be noted that, in other implementations, in order to improve the shape quality, position precision and size precision of the remaining first channel material laminate after etching, a hard mask layer may further be formed between the first channel material laminate and the pattern layer. The hard mask layer may also be a silicon oxide layer, a silicon nitride layer, or a laminate structure (that is, an ON structure) consisting of a silicon oxide layer and a silicon nitride layer. Moreover, the epitaxial growth process has relatively small impact on the hard mask layer; therefore, after the multiple first channel material laminates of the second region are removed, only the pattern layer may be removed or both the pattern layer and the hard mask layer may be removed before the epitaxy process.

Further referring to FIG. 7 and FIG. 8, in some implementations, the channel structure layer 120 further includes a third channel structure layer 123 located on at least one fin 112. The third channel structure layer 123 includes a third channel layer 136, a second sacrificial layer 137 located on the third channel layer 136, and a fourth channel layer 138 located on the second sacrificial layer 137.

The third channel layer 136 is in contact with the top of the fin 112, so that heat subsequently generated during working of the device can be dissipated through the fin 112 and the substrate 111 easily, thereby helping alleviate the self-heating effect of the device. The second sacrificial layer 137 is used for occupying a spatial position for forming a gate structure subsequently, so that the subsequent gate structure can cover the fourth channel layer 138, thereby correspondingly increasing the area of a channel controlled by the gate structure subsequently and helping alleviate the short-channel effects. Therefore, through the third channel structure 123, the device formed on the third region 111c can have features of both a GAA transistor and a fin-type field effect transistor, thereby helping further balance the short-channel effects and the self-heating effect of the device and further improving overall performance of the device.

In some implementations, in order to improve the process compatibility and reduce the process difficulty of forming the semiconductor structure, a material of the second sacrificial layer 137 is the same as the material of the first sacrificial layer 131, and materials of the third channel layer 136 and the fourth channel layer 138 are the same as the material of the first channel layer 132. Therefore, the material of the second sacrificial layer 137 is SiGe, and the materials of the third channel layer 136 and the fourth channel layer 138 are both Si.

In addition, the thickness of the second sacrificial layer 137 is equal to the thickness of the first sacrificial layer 131, so that after a gate structure is formed subsequently, the gate structure at positions of the first sacrificial layer 131 and the second sacrificial layer 137 has the same thickness, thereby helping reduce the difficulty of adjusting the performance of devices.

Specifically, the step of forming the third channel structure layer 123 includes: as shown in FIG. 6, forming a second channel material laminate 139a on the fin material layer 112a of the third region 111c, where the second channel material laminate 139a includes a third channel material layer 136a, a second sacrificial material layer 137a located on the third channel material layer 136a, and a fourth channel material layer 138a located on the second sacrificial material layer 137a; as shown in FIG. 7 or FIG. 8, patterning the second channel material laminate 139a (as shown in FIG. 6) and the fin material layer 112a (as shown in FIG. 6) of the third region 111c, where after the fin 112 is formed on the substrate 111, the remaining second channel material laminate on the fin 112 of the third region 111c is used as the third channel structure layer 123.

In some implementations, forming the second channel material laminate after forming the second channel material layer 135a is used as an example for description.

As shown in FIG. 2 and FIG. 3, after the multiple first channel material laminates 130a are formed, the multiple first channel material laminates 130a are also located on the fin material layer 112a of the third region 111c. Therefore, in the step of forming the pattern layer 140 (as shown in FIG. 3), the pattern layer 140 further covers the first channel material laminate 130 of the third region 111c. Correspondingly, the step of forming the second channel material laminate 139a includes: after forming the second channel material layer 135a, removing the multiple first channel material laminates 130a of the third region 111c to expose the fin material layer 112a of the third region 111c; after removing the multiple first channel material laminates 130a of the third region 111c, forming the second channel material laminate 139a on the fin material layer 112a of the third region 111c.

In some implementations, also through a mask, the second channel material laminate 139a is selectively formed on the fin material layer 112a of the third region 111c by using an etching process, an epitaxial growth process and planarization treatment in combination. For the specific description about the step of forming the second channel material laminate 139a, reference can be made to the corresponding description about the foregoing step of forming the second channel material layer 135a, and details are not described herein again.

Further referring to FIG. 7 and FIG. 8, after the channel structure layer 120 is formed, the method further includes: forming an isolation structure 113 on the substrate 111 exposed by the channel structure layer 120, where the isolation structure 113 exposes lateral sides of the channel structure layer 120.

The isolation structure 113 is used for isolating adjacent devices or adjacent channel laminates 130. In some implementations, a material of the isolation structure 113 is silicon oxide. In other implementations, the material of the isolation structure may also be other insulating materials such as silicon nitride or silicon oxynitride.

In some implementations, the top surface of the isolation structure 113 is flush with the top surface of the fin 112, so as to prevent the fin 112 from being used as a channel.

Figure 9:
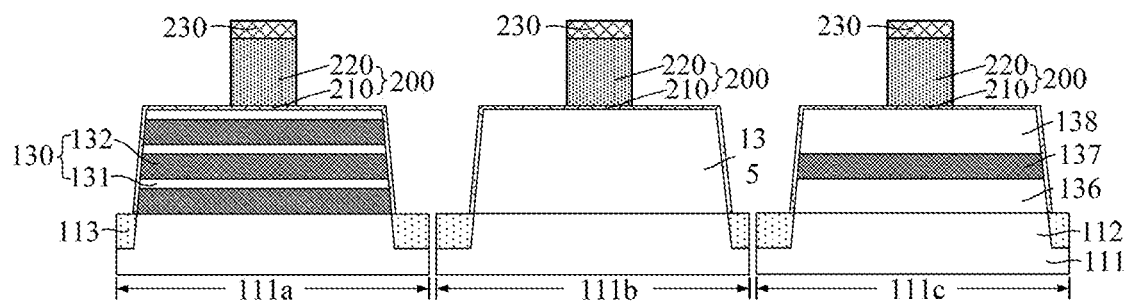
Figure 10:
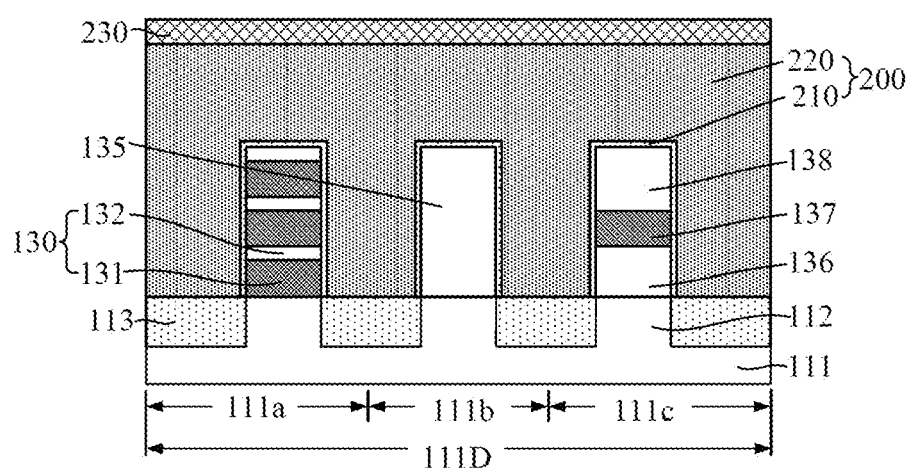

Referring to FIG. 9 and FIG. 10 in combination, FIG. 9 is a cross-sectional view based on FIG. 8, and FIG. 10 is a cross-sectional view of FIG. 9 along a direction perpendicular to a fin extension direction. A dummy gate structure 200 across the channel structure layer 120 (as shown in FIG. 7 or FIG. 8) of the device unit area 111D (as shown in FIG. 10) is formed, and the dummy gate structure 200 covers a part of the top and a part of the lateral sides of the channel structure layer 120.

The dummy gate structure 200 is used for occupying a spatial position for forming a gate structure subsequently. In some implementations, the dummy gate structure 200 includes a dummy gate layer 220. The dummy gate layer 220 crosses the channel structure layer 120 of the device unit area 111D and covers the part of the top and the part of the lateral sides of the channel structure layer 120.

In some implementations, a material of the dummy gate layer 220 is polycrystalline silicon. In other implementations, the material of the dummy gate layer may also be silicon oxide, silicon nitride, silicon oxynitride, silicon carbide, silicon carbonitride, silicon oxy-carbonitride, amorphous carbon or the like.

In some implementations, the dummy gate structure 200 is of a laminate structure. Therefore, before the dummy gate layer 220 is formed, the method further includes: forming a gate oxide layer 210 conformally covering the surface of the channel structure layer 120. Correspondingly, the dummy gate layer 220 covers the gate oxide layer 210 on the surface of the part of the top and the part of the lateral sides of the channel structure layer 120. The dummy gate layer 220 and the gate oxide layer 210 located at the bottom of the dummy gate layer 220 are used for forming the dummy gate structure 200. In other implementations, the dummy gate structure may also be of a single-layer structure, and the dummy gate structure only includes the dummy gate layer correspondingly.

In some implementations, a material of the gate oxide layer 210 is silicon oxide. In other implementations, the material of the gate oxide layer may also be silicon oxynitride.

In some implementations, a gate mask layer 230 is formed on the top of the dummy gate layer 220. The gate mask layer 230 is used as an etching mask for forming the dummy gate layer 220. A material of the gate mask layer 230 is silicon nitride, and the gate mask layer 230 is further used for protecting the top of the dummy gate layer 220 during a subsequent process.

It should be noted that, for ease of illustration, only one dummy gate structure 200 is shown on one channel structure layer 120. However, the quantity of dummy gate structures 200 formed on one channel structure layer 120 is not limited to one.

Figure 11:
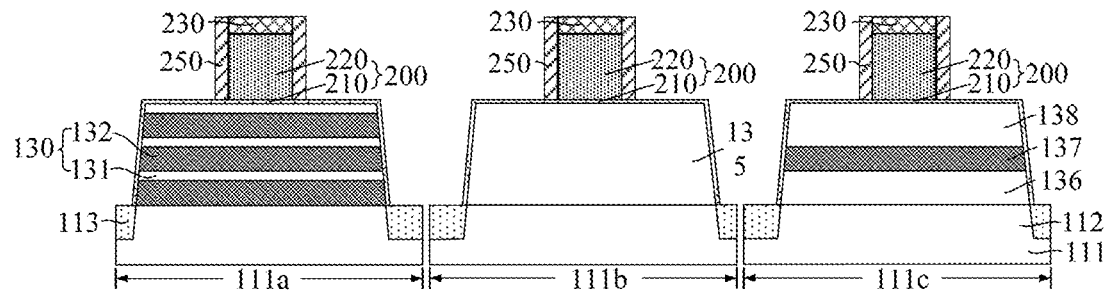

With reference to FIG. 11 in combination, FIG. 11 is a cross-sectional view based on FIG. 9. After the dummy gate structure 200 is formed, the method further includes: forming spacers 250 on lateral sides of the dummy gate layer 220.

The spacer 250 is used as etching masks in the subsequent etching process, so as to define a region for forming a source-drain doping layer subsequently. A material of the spacer 250 may be one or more of silicon oxide, silicon nitride, silicon carbide, silicon carbonitride, silicon oxycarbonitride, silicon oxynitride, boron nitride and boron carbonitride, and the spacer 250 may be of a single-layer structure or a laminate structure. In some implementations, the spacer 250 is of a single-layer structure, and the material of the spacer 250 is silicon nitride.

It should be noted that, the gate mask layer 230 is further formed on the top of the dummy gate layer 220. Therefore, the spacers 250 further cover lateral sides of the gate mask layer 230.

It should be further noted that, after the spacers 250 are formed, the gate oxide layer 210 exposed by the spacers 250 and the dummy gate layer 220 is retained. The gate oxide layer 210 can protect the channel structure layer 120 (as shown in FIG. 7 or FIG. 8) in a subsequent process. In other implementations, it is also possible to remove the gate oxide layer exposed by the spacers and the dummy gate layer, and only retain the gate oxide layer covered by the dummy gate layer and the spacers; the channel structure layer on two sides of the dummy gate layer are exposed, to facilitate subsequent process steps.

Figure 13:
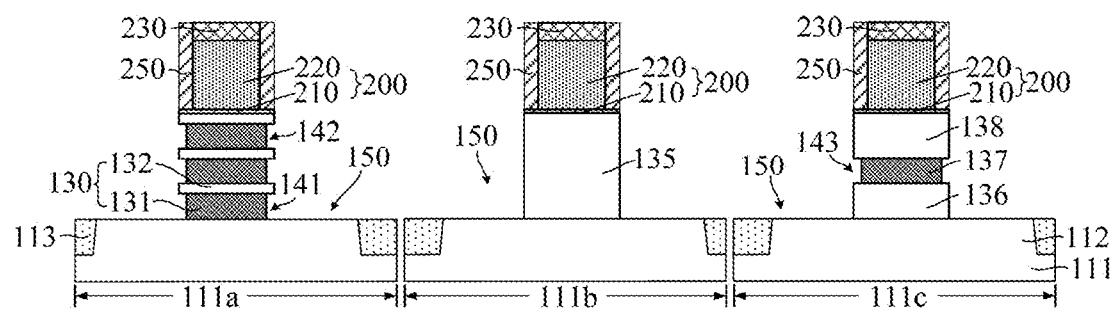
Figure 14:
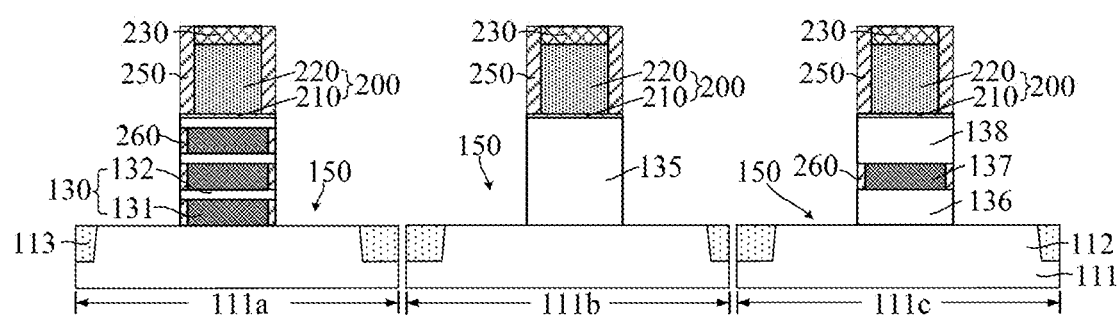
Figure 15:
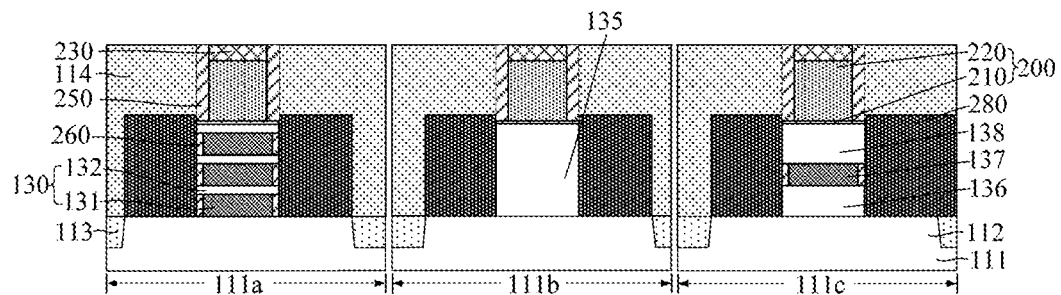

Referring to FIG. 12 to FIG. 15 in combination, a source-drain doping layer 280 (as shown in FIG. 15) is formed in the channel structure layer 120 (as shown in FIG. 7 or FIG. 8) on two sides of the dummy gate structure 200.

In some implementations, the source-drain doping layer 280 is formed by using an epitaxy process and a doping process. The source-drain doping layer 280 includes a stress layer. When the formed device is a PMOS transistor, a material of the stress layer is Si or SiGe, and ions doped in the stress layer are P-type ions. When the formed device is an NMOS transistor, the material of the stress layer is Si or SiC, and ions doped in the stress layer are N-type ions.

In some implementations, the top of the source-drain doping layer 280 is higher than the top of the channel structure layer 120, and the source-drain doping layer 280 further covers a part of the lateral side of the spacer 250. In other implementations, the top of the source-drain doping layer may further be flush with the top of the channel structure layer.

Figure 12:
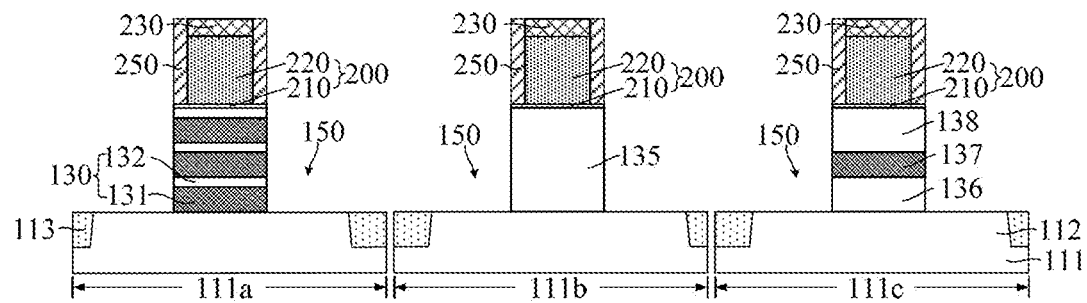

It should be noted that, after the dummy gate structure 200 is formed and before the source-drain doping layer 280 is formed in the channel structure layer 120 on two sides of the dummy gate structure 200, the method further includes: as shown in FIG. 12, etching the gate oxide layer 210 and the channel structure layer 120 (as shown in FIG. 7 or FIG. 8) on two sides of the dummy gate structure 200, and forming, in the channel structure layer 120, grooves 150 (as shown in FIG. 12) that expose the fins 112.

The grooves 150 are used for providing spatial positions for forming the source-drain doping layer 280 subsequently. The grooves 150 are further used for providing a process foundation for forming a first trench, a second trench and a third trench subsequently.

The shape of the groove 150 may be square-shaped, U-shaped or Sigma-shaped. In some implementations, in order to reduce adverse impact on the device channel caused by the process of forming the groove 150, the shape of the groove 150 is square-shaped.

In some implementations, in order to improve the shape quality of the grooves 150, by using the spacers 250 as masks, the channel structure layer 120 on two sides of the dummy gate structure 200 is etched by using a dry etch process, so as to form, in the channel structure layer 120, the grooves 150 that expose the fins 112. Specifically, a main etching gas used in the dry etch process includes a fluorine-based gas, such as $CF_4$, $CHF_3$ or $C_2F_6$.

Correspondingly, after the grooves 150 are formed, along an extension direction of the fin 112 (that is, along a direction perpendicular to the lateral side of the dummy gate structure 200), a lateral side of the groove 150 which faces towards the dummy gate structure 200 is flush with a lateral side of the spacer 250 which is away from the gate layer 220.

In other implementations, according to actual process requirements, the channel structure layer on two sides of the dummy gate structure may also be etched by using a wet etch process or a wet-dry combined etch process.

As shown in FIG. 13, a part of the first sacrificial layer 131 and a part of the second sacrificial layer 137 that are exposed by the grooves 150 are etched along the direction perpendicular to the lateral side of the dummy gate structure 200, so that the fin 112, the first channel layer 132 adjacent to the fin 112 and the remaining first sacrificial layer 131 form a first trench 141, adjacent first channel layers 132 and the remaining first sacrificial layer 131 between the adjacent first channel layers 132 form a second trench 142, and the third channel layer 136, the fourth channel layer 138 and the remaining second sacrificial layer 137 form a third trench 143.

The first trench 141, the second trench 142 and the third trench 143 are used for providing spatial positions for forming barrier layers 260.

In some implementations, the first sacrificial layer 131 and the second sacrificial layer 137 that are exposed by the grooves 150 are etched along the direction perpendicular to the lateral side of the dummy gate structure 200 using the wet etch process. The wet etch process has an isotropic etching characteristic. Therefore, after the wet etch process, along the direction perpendicular to the lateral side of the dummy gate layer 220, two sides of the remaining first sacrificial layer 131 below the dummy gate layer 220 of the first region 111a expose a part of the first channel layer 132, and two sides of the remaining second sacrificial layer 137 below the dummy gate layer 220 of the third region 111c expose a part of the third channel layer 136 and a part of the fourth channel layer 138, thereby forming the first trench 141, the second trench 142 and the third trench 143.

In some implementations, by using HCl vapor, wet etching is performed on the first sacrificial layer 131 and the second sacrificial layer 137 that are exposed by the grooves 150. An etching rate of the HCl vapor with respect to the SiGe material is much higher than an etching rate with respect to the Si material. Therefore, by etching the first sacrificial layer 131 and the second sacrificial layer 137 that are exposed by the grooves 150 using the HCl vapor, the probability of damage on the first channel layer 132, the second channel layer 135, the third channel layer 136 and the fourth channel layer 138 can be effectively reduced, thereby helping improve the device performance.

In other implementations, when the materials of the first channel layer, the second channel layer, the third channel layer, the fourth channel layer and the fins are all SiGe, and the materials of the first sacrificial layer and the second sacrificial layer are both Si, an etching solution used in the wet etch process is correspondingly a tetramethylammonium hydroxide (TMAH) solution. An etching rate of the TMAH solution with respect to the Si material and an etching rate with respect to the SiGe material have a relatively large difference, and therefore the probability of damage on the first channel layer, the second channel layer, the third channel layer and the fourth channel layer can also be reduced.

As shown in FIG. 14, barrier layers 260 are formed in the first trench 141 (as shown in FIG. 13), the second trench 142 (as shown in FIG. 13) and the third trench 143 (as shown in FIG. 13).

A metal gate structure will be formed at positions of the dummy gate structure 200, the remaining first sacrificial layer 131 and the remaining second sacrificial layer 137 subsequently. The barrier layers 260 are correspondingly located between the metal gate structure and the source-drain doping layer 280 subsequently formed in the grooves 150. The barrier layers 260 are used for reducing parasitic capacitance between the source-drain doping layer 280 and gate electrodes in the metal gate structure.

A material of the barrier layers 260 can desirably reduce the parasitic capacitance. Moreover, in order to reduce impact on the device performance, the material of the barrier layers 260 is a dielectric material.

In some implementations, the material of the barrier layers 260 is a low k dielectric material. The low k dielectric material may be SiON, SiOCN, SiCN, SiOH, SiOCH, fluorine-doped silicon dioxide (FSG), boron-doped silicon dioxide (BSG), phosphor-doped silicon dioxide (PSG), boron-phosphor-doped silicon dioxide (BPSG), hydrogen silsesquioxane (HSQ, $(HSiO_{1.5})n$), or methylsilsesquioxane (MSQ, $(CHsSiO_{1.5})_n$). The low k dielectric material refers to a dielectric material with a relative dielectric constant greater than or equal to 2.6 and less than or equal to 3.9. The selection of the low k dielectric material helps further reduce the parasitic capacitance between the gate electrode in the metal gate structure and the source-drain doping layer 280. In other implementations, the material of the barrier layers may also be silicon nitride, silicon oxynitride, silicon oxide or a super-low k dielectric material. The super-low k dielectric material refers to a dielectric material with a relative dielectric constant less than 2.6.

In some implementations, the barrier layers 260 are formed by using a deposition process and a blanket dry etch process. Moreover, the deposition process has a desirable filling property, thereby improving the forming quality of the barrier layers 260 in the first trench 141, the second trench 142 and the third trench 143.

As the first trench 141, the second trench 142 and the third trench 143 generally have relatively small depths, the deposition process may be an atomic layer deposition process. By using the atomic layer deposition process, the first trench 141, the second trench 142 and the third trench 143 are filled with the material of the barrier layers 260. In other implementations, the deposition process may also be a chemical vapor deposition process with a relatively good filling property, for example, a low pressure chemical vapor deposition (LPCVD) process.

Specifically, the step of forming the barrier layers 260 includes: forming a barrier material layer (not shown in the figure) conformally covering the top and lateral sides of the dummy gate layer 220, the lateral sides of the first channel layer 132, the lateral sides of the second channel layer 135, the lateral sides of the third channel layer 136, the lateral sides of the fourth channel layer 138, and the surface of the fins 112, where the barrier material layer is further filled in the first trench 141, the second trench 142 and the third trench 143; removing the barrier material layer on the top and lateral sides of the dummy gate layer 220, the lateral sides of the channel structure layer 120 and the surface of the fins 112 by using a blanket dry etch process, and retaining the remaining barrier material layer in the first trench 141, the second trench 142 and the third trench 143 as the barrier layers 260.

It should be noted that, the spacers 250 are formed on the lateral sides of the dummy gate layer 220, the gate mask layer 230 is formed on the top of the dummy gate layer 220, and the isolation structure 113 is formed on the substrate 111 exposed by the fin 112. Therefore, the barrier material layer further covers the lateral sides and top of the spacers 250, the top of the gate mask layer 230 and the surface of the isolation structure 113.

By using the blanket dry etch process, the barrier material layer on the lateral sides and top of the spacers 250, the top of the gate mask layer 230, the lateral sides of the first channel layer 132, the lateral sides of the second channel layer 135, the lateral sides of the third channel layer 136, the lateral sides of the fourth channel layer 138, and the surface of the fins 112 and the surface of the isolation structures 113 are removed, while the barrier material layer in the first trench 141 and the second trench 142 is retained under the coverage of the spacers 250 and the first channel layer 132, and the barrier material layer in the third trench 143 is retained under the coverage of the spacers 250, the third channel layer 136 and the fourth channel layer 138.

With reference to FIG. 15 in combination, correspondingly, after the barrier layers 260 are formed, the source-drain doping layer 280 is formed in each groove 150 (as shown in FIG. 14).

Specifically, the step of forming the source-drain doping layer 280 includes: filling a stress material in the groove 150 using a selective epitaxy process to form the stress layer, and in-situ auto-doping ions of a corresponding type in the process of forming the stress layer, so as to form the source-drain doping layer 280. In other implementations, after the stress layer is formed in the groove, ion doping may also be performed on the stress layer to form the source-drain doping layer.

It should be noted that, after the source-drain doping layer 280 is formed in the groove 150, the subsequent process further includes:

further referring to FIG. 15, forming an interlayer dielectric layer 114 on the substrate 111 exposed by the dummy gate structure 200, where the interlayer dielectric layer 114 covers the top of the source-drain doping layer 280 and the lateral sides of the dummy gate structure 200.

The interlayer dielectric layer 114 is used for implementing electrical isolation between adjacent semiconductor structures, and is further used for defining the size and position of subsequent gate structure. A material of the interlayer dielectric layer 114 is an insulating material. In some implementations, the material of the interlayer dielectric layer 114 is silicon oxide. In other implementations, the material of the interlayer dielectric layer may also be other dielectric materials such as silicon nitride or silicon oxynitride.

In some implementations, the top of the interlayer dielectric layer 114 is flush with the top of the gate mask layer 230, thereby providing a process foundation for the subsequent step of removing the dummy gate structure 200 while improving the flatness of the surface of the interlayer dielectric layer 114.

Figure 16:
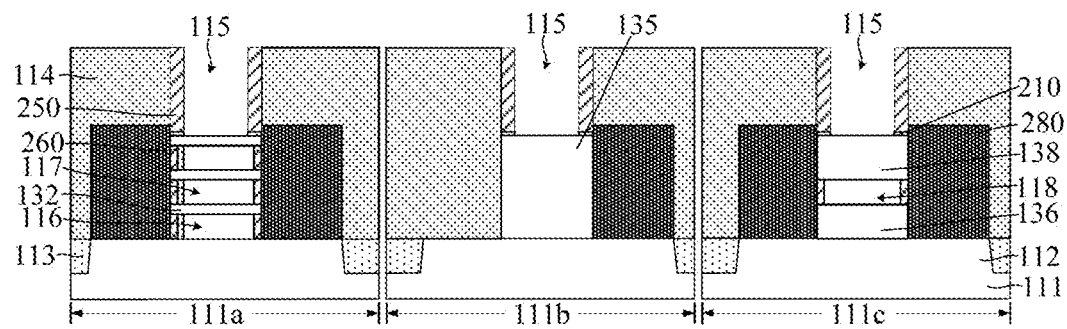
Figure 17:
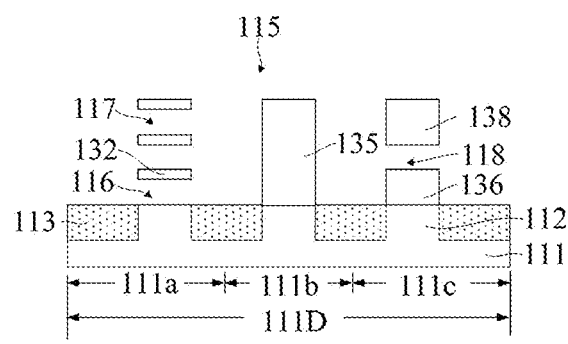
Figure 18:
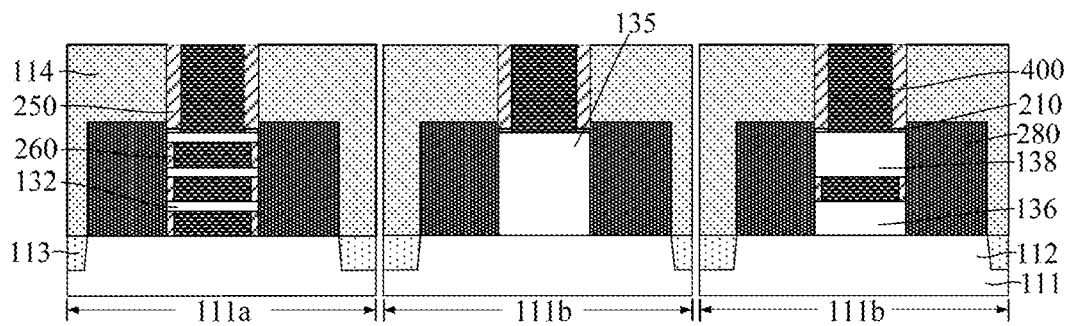
Figure 19:
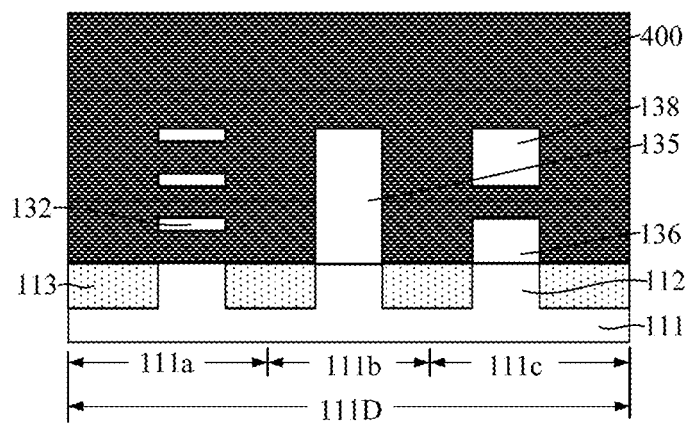

With reference to FIG. 16 to FIG. 19 in combination, FIG. 16 is a cross-sectional view based on FIG. 15, FIG. 17 is a cross-sectional view, along a direction perpendicular to the fin extension direction, at the position of a gate opening of FIG. 16, FIG. 18 is a cross-sectional view based on FIG. 16, and FIG. 19 is a cross-sectional view, along the direction perpendicular to the fin extension direction, on the top of the gate structure of FIG. 18. After the interlayer dielectric layer 114 is formed, a gate structure 400 (as shown in FIG. 18 or FIG. 19) is formed at positions of the dummy gate structures 200 (as shown in FIG. 15) and the first sacrificial layers 131 (as shown in FIG. 15).

In some implementations, the gate structure 400 is of a metal gate structure, and correspondingly, the gate structure 400 includes a gate dielectric layer (not marked) and a gate electrode (not marked) located on the gate dielectric layer. Specifically, the gate dielectric layer of the first region 111a covers the upper surface, the lower surface and the side surfaces of the first channel layer 132 and further covers a part of the top and a part of the lateral sides of the fin 112. The gate dielectric layer of the second region 111b covers a part of the top and a part of the lateral sides of the second channel layer 135.

In some implementations, a material of the gate dielectric layer is a high k dielectric material. The high k dielectric material refers to a dielectric material with a relative dielectric constant greater than that of silicon dioxide. Specifically, the material of the gate dielectric layer is $HfO_2$. In other implementations, the material of the gate dielectric layer may also be selected from $ZrO_2$, HfSiO, HfSiON, HfTaO, HfTiO, HfZrO, $Al_2O_3$ or the like.

In some implementations, the material of the gate electrode is W. In other implementations, the material of the gate electrode may also be a conductive material such as Al, Cu, Ag, Au, Pt, Ni or Ti.

It should be noted that, the device unit area 111D (as shown in FIG. 19) further includes a third region 111c. Therefore, the gate structure 400 is further formed at the position of the second sacrificial layer 137 (as shown in FIG. 15), and the gate dielectric layer of the third region 111c correspondingly covers the upper surface and side surfaces of the third channel layer 136, and the upper surface, the lower surface and the side surfaces of the fourth channel layer 138.

Specifically, the step of forming the gate structure 400 includes: referring to FIG. 16 and FIG. 17 in combination, removing the dummy gate structures 200 (as shown in FIG. 15), and forming, in the interlayer dielectric layer 114, gate openings 115 exposing the channel structure layer 120 (as shown in FIG. 7 or FIG. 8); removing the first sacrificial layers 131 (as shown in FIG. 15) and the second sacrificial layer 137 (as shown in FIG. 15) that are exposed by the gate openings 115; forming, between the fin 112 of the first region 111a and the first channel layer 132 adjacent to the fin 112, a first gap 116 in communication with the gate opening 115; forming, between the adjacent first channel layers 132, a second gap 117 in communication with the gate opening 115; and forming, between the third channel layer 136 and the fourth channel layer 138, a third gap 118 in communication with the gate opening 115.

In some implementations, after the gate openings 115 are formed, the channel structure layer 120 protrudes from the bottom of the gate openings 115, and along the extension direction of the fin 112, the gate openings 115 expose the remaining first sacrificial layers 131 and the lateral sides of the second sacrificial layer 137.

In some implementations, the remaining first sacrificial layers 131 and the second sacrificial layer 137 that are exposed by the gate openings 115 are removed by means of wet etching. Specifically, the remaining first sacrificial layers 131 and the second sacrificial layer 137 that are exposed by the gate openings 115 are removed using HCl vapor, thereby reducing damage on the first channel layers 132, the second channel layer 135, the third channel layer 136 and the fourth channel layer 138 caused by the wet etch process.

It should be noted that, the first sacrificial layers 131 and the second sacrificial layer 137 are removed after the source-drain doping layer 280 is formed. Therefore, after the remaining first sacrificial layers 131 and the second sacrificial layer 137 that are exposed by the gate openings 115 are removed, along the extension direction of the fin 112, two ends of each first channel layer 132 are connected to the source-drain doping layer 280 of the first region 111a, two ends of the fourth channel layer 138 are connected to the source-drain doping layer 280 of the third region 111c, and the first channel layer 132 and the fourth channel layer 138 are suspended in the gate openings 115, thereby providing a foundation for enabling the gate structure 400 (as shown in FIG. 18 and FIG. 19) to surround the first channel layers 132 and the fourth channel layer 138.

With reference to FIG. 18 and FIG. 19 in combination, the gate structure 400 is formed in the gate openings 115 (as shown in FIG. 16 or FIG. 17), the first gap 116 (as shown in FIG. 16 or FIG. 17), the second gap 117 (as shown in FIG. 16 or FIG. 17) and the third gap 118 (as shown in FIG. 16 or FIG. 17).

Figure 20:
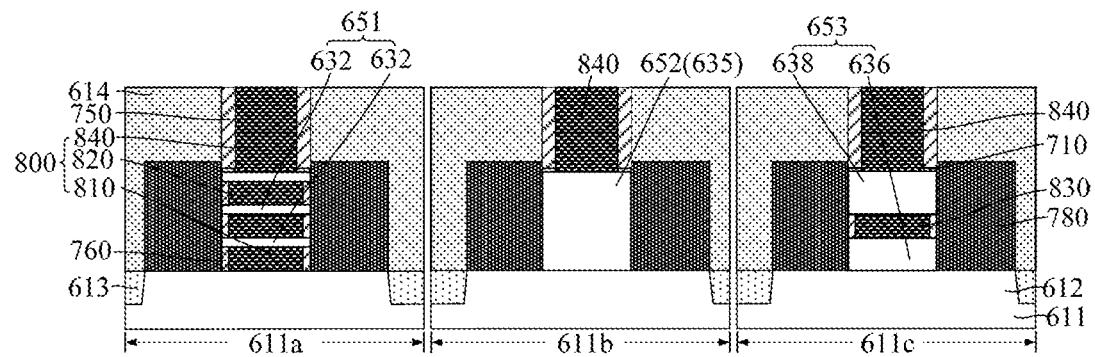
FIG. 20 to FIG. 21 are schematic structural diagrams of an implementation of a semiconductor structure.
Figure 21:
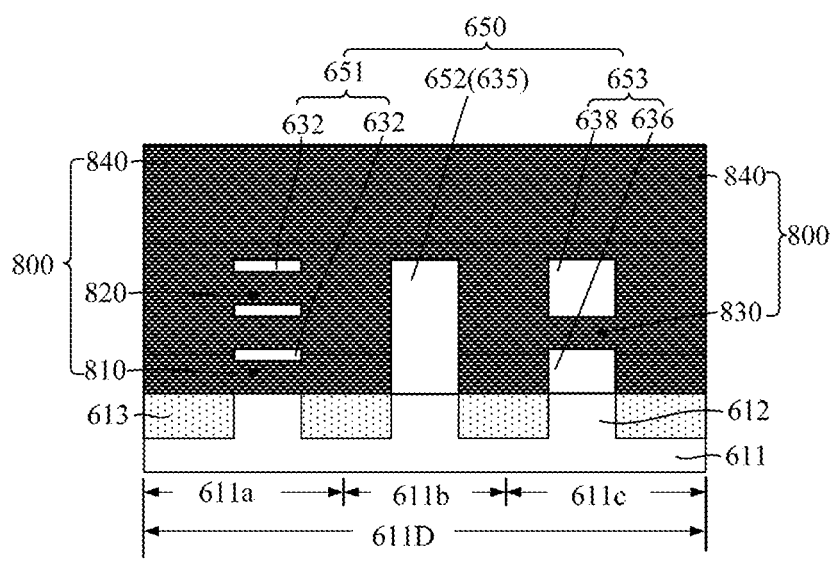

Another form of the present disclosure provides a semiconductor structure. Referring to FIG. 20 and FIG. 21, FIG. 20 and FIG. 21 show schematic structural diagrams of one form of a semiconductor structure according to the present disclosure. FIG. 20 is a cross-sectional view along a fin extension direction in different regions, and FIG. 21 is a cross-sectional view of FIG. 20 along a direction perpendicular to the fin extension direction.

The semiconductor structure includes: a substrate 611, the substrate 611 including a device unit area 611D (as shown in FIG. 21), where at least two fins 612 are formed on the substrate 611 of the device unit area 611D; a channel structure 650 (as shown in FIG. 21) located on the fins 612, where the channel structure 650 includes a first channel structure 651 located on at least one fin 612 and a second channel structure 652 located on at least one fin 612, the first channel structure 651 is spaced apart from the fin 612 and includes multiple first channel layers 632 spaced apart, and the second channel structure 652 is a second channel layer 635 of a single-layer structure; a gate structure 800 across the channel structure 650, where the gate structure 800 covers a part of the top and a part of lateral sides of the channel structure 650 and surrounds the first channel layers 632; and a source-drain doping layer 780 penetrating through the channel structure 650 on two sides of the gate structure 800.

In some implementations, the fins 612 and the substrate 611 are of an integrated structure. The substrate 611 is a silicon substrate, and a material of the fins 612 is silicon. For the specific description about the substrate 611 and the fins 612, reference can be made to the corresponding description in the foregoing embodiment. Details are not described herein again.

The fins 612 expose a part of the substrate 611, thereby providing a process foundation for forming an isolation structure.

Therefore, in some implementations, the semiconductor structure further includes: an isolation structure 613 located on the substrate 611 exposed by the fins 612. The isolation structure 613 is used for isolating adjacent devices. In some implementations, the material of the isolation structure 613 is silicon oxide. In other implementations, the material of the isolation structure may also be another insulating material such as silicon nitride or silicon oxynitride.

In some implementations, the top of the isolation structure 613 is flush with the top of the fins 612, so as to prevent the fins 612 from being used as channels.

In some implementations, the semiconductor structure is a high current device. Therefore, at least two fins 612 are formed on the substrate 611 of the device unit area 611D, and each gate structure 800 crosses multiple fins 612 of the device unit area 611D. Therefore, the device unit area 611D includes a first region 611a and a second region 611b, the first channel structure 651 is located on the fin 612 of the first region 611a, and the second channel structure 652 is located on the fin 612 of the second region 611b. The first channel layer 632 is used for providing a device channel of the first region 611a, and the second channel layer 635 is used for providing a device channel of the second region 611b.

The first channel structure 651 is spaced apart from the fin 612, and the first channel structure 651 includes multiple first channel layers 632 spaced apart, so that the gate structure 800 can surround the first channel layers 632 to improve a channel controlling capability of the gate structure 800. The second channel layer 635 is in contact with the top of the fin 612. By using the second channel structure 652, heat generated by a device during working can be dissipated through the fin 612 and the substrate 611 easily, thereby alleviating a self-heating effect of the device. In summary, by integrating the structure of a GAA transistor and the structure of a fin-type field effect transistor into one device unit area 611D, some implementations improves overall performance of the device.

It should be noted that, when the quantity of the fins 612 of the device unit area 611D is greater than or equal to three, if the device unit area 611D only includes the first region 611a and the second region 611b, the first regions 611a are located on two sides of the device unit area 611D along a direction perpendicular to an extension direction of the fin 612, and the second region 611b is located between the adjacent first regions 611a.

Heat of a device located at the center of the device unit area 611D cannot be dissipated easily. Therefore, by arranging the second region 611b between the adjacent first regions 611a, the self-heating effect of the device can be further alleviated. In other implementations, a position relation between the first region and the second region can be set reasonably according to the quantity of fins in the device unit area and actual process requirements.

In some implementations, in order to improve the process compatibility, a material of the first channel layers 632 is the same as a material of the second channel layer 635, and is the same as the material of the fins 612. The materials of the first channel layers 632 and the second channel layer 635 are both Si. In other implementations, when the semiconductor structure is a PMOS transistor, in order to improve performance of the PMOS transistor, a SiGe channel technology is generally used. Correspondingly, the materials of the first channel layers, the second channel layer and the fins are all SiGe.

In some implementations, the channel structure 650 further includes a third channel structure 653 (as shown in FIG. 20 or FIG. 21) located on at least one fin 612. The third channel structure 653 includes a third channel layer 636 located on the fin 612 and a fourth channel layer 638 that is located above the third channel layer 636 and spaced apart from the third channel layer 636.

Correspondingly, the device unit area 611D further includes a third region 611c. The third channel structure 653 is located on the fin 612 in the third region 611c. The third channel layer 636 and the fourth channel layer 638 are used for providing a device channel of the third region 611c.

The third channel layer 636 is in contact with the top of the fin 612, so that heat generated during working of a device can be dissipated through the fin 612 and the substrate 611 easily, thereby helping alleviate the self-heating effect of the device. The gate structure 800 surrounds the fourth channel layer 638, and the area of a channel controlled by the gate structure 800 is increased correspondingly, thereby helping alleviate the short-channel effects. Therefore, by using the third channel structure 653, the device located in the third region 611c can have characteristics of both a GAA transistor and a fin-type field effect transistor, thereby helping further balance the short-channel effects and the self-heating effect of the device, and further improving overall performance of the device.

In some implementations, in order to improve the process compatibility and reduce the process difficulty of forming the semiconductor structure, materials of the third channel layer 636 and the fourth channel layer 638 are the same as the material of the first channel layers 632. Specifically, the materials of the third channel layer 636 and the fourth channel layer 638 are both Si.

In some implementations, for example, if one fin 612 is formed on the substrate 611 of each of the first region 611a, the second region 611b and the third region 611c, in order to improve overall performance of devices, along a direction perpendicular to the extension direction of the fin, the first region 611a is located on one side of the device unit area 611D, the third region 611c is located on the other side of the device unit area 611D, and the second region 611b is located between the first region 611a and the third region 611c.

The gate structure 800 crosses the channel structure 650 and covers the part of the top and the part of lateral sides of the channel structure 650, and the gate structure 800 further surrounds the first channel layers 632. That is, the gate structure 800 of the first region 611*a* covers the upper surface, the lower surface, and the side surfaces of each first channel layer 632 as well as a part of the top of the fin 612 of the first region 611*a*, and the gate structure 800 of the second region 611*b* covers a part of the top and a part of lateral sides of the second channel layer 635.

In some implementations, the gate structure 800 is of a metal gate structure, and the gate structure 800 includes a gate dielectric layer (not marked) and a gate electrode (not marked) located on the gate dielectric layer.

A material of the gate dielectric layer is a high k dielectric material. The high k dielectric material refers to a dielectric material with a relative dielectric constant greater than that of silicon oxide. In some implementations, the material of the gate dielectric layer is $HfO_2$. In other implementations, the material of the gate dielectric layer may also be selected from $ZrO_2$, HfSiO, HfSiON, HfTaO, HfTiO, HfZrO, $Al_2O_3$ or the like.

In some implementations, a material of the gate electrode is W. In other implementations, the material of the gate electrode may also be Al, Cu, Ag, Au, Pt, Ni, Ti or the like.

The device unit area 611D further includes the third region 611*c*. Therefore, the gate structure 800 further surrounds the fourth channel layer 638. That is, the gate structure 800 of the third region 611*c* covers the upper surface and the side surfaces of the third channel layer 636 as well as the upper surface, the lower surface and the side surfaces of the fourth channel layer 638.

In some implementations, the gate structure 800 located between the fin 612 and the first channel layer 632 adjacent to the fin 612 is a first gate structure part 810, the gate structure 800 located between the adjacent first channel layers 632 is a second gate structure part 820, and the gate structure 800 located between the third channel layer 636 and the fourth channel layer 638 is a third gate structure part 830. Along a direction perpendicular to the lateral side of the gate structure 800, two sides of the first gate structure part 810 and two sides of the second gate structure part 820 expose a part of the first channel layer 632, and two sides of the third gate structure part 830 expose a part of the third channel layer 636 and a part of the fourth channel layer 638. The semiconductor structure further includes: barrier layers 760 (as shown in FIG. 20) located on lateral sides of the first gate structure part 810, the second gate structure part 820 and the third gate structure part 830. The barrier layers 760 further cover the surfaces of the first channel layers 632 exposed by the first gate structure part 810 and the second gate structure part 820, as well as the surface of the third channel layer 636 and the surface of the fourth channel layer 638 that are exposed by the third gate structure part 830.

The barrier layers 760 increase distances from gate electrodes in the first gate structure part 810, the second gate structure part 820 and the third gate structure part 830 to a source-drain doping layer 780, thereby reducing parasitic capacitance between the gate electrodes in the first gate structure part 810, the second gate structure part 820 and the third gate structure part 830 and the source-drain doping layer 780, and thereby helping improve device performance.

In order to reduce impact on the device performance, a material of the barrier layers 760 is a dielectric material. In some implementations, the material of the barrier layers 760 is a low k dielectric material, thereby further helping reduce the parasitic capacitance between the gate electrodes in the gate structure 800 and the source-drain doping layer 780. In other implementations, the material of the barrier layers may also be silicon nitride, silicon oxynitride, silicon oxide or a super-low k dielectric material.

It should be noted that, the thickness of the third gate structure part 830 is equal to the thickness of the first gate structure part 810 and the second gate structure part 820, thereby helping reduce the difficulty of adjusting performance of devices.

In some implementations, the remaining gate structure 800 is a fourth gate structure part 840. The fourth gate structure part 840 covers the part of the top and the part of lateral sides of the channel structure 650. The semiconductor structure further includes: spacers 750 (as shown in FIG. 19), where the spacers 750 cover the lateral sides of the fourth gate structure part 840, and lateral sides of the spacers 750 are flush with the lateral sides of the barrier layer 760.

In some implementations, the spacer 750 is of a single-layer structure, and a material of the spacer 750 is silicon nitride. For the specific description about the spacer 750, reference can be made to the corresponding description in the foregoing implementations. Details are not described herein again.

In some implementations, the source-drain doping layer 780 includes a stress layer doped with ions. Specifically, when the semiconductor structure is a PMOS transistor, the material of the stress layer is Si or SiGe, and the ions doped in the stress layer are P-type ions. When the semiconductor structure is an NMOS transistor, the material of the stress layer is Si or SiC, and the ions doped in the stress layer are N-type ions.

In some implementations, the top of the source-drain doping layer 780 is higher than the top of the channel structure 650. The source-drain doping layer 780 further covers a part of the lateral sides of the spacers 750. In other implementations, the top of the source-drain doping layer may also be flush with the top of the channel structure.

In some implementations, the semiconductor further includes: an interlayer dielectric layer 614 located on the substrate 611 exposed by the gate structure 800. The interlayer dielectric layer 614 covers the source-drain doping layer 780 and exposes the top of the gate structure 800.

The interlayer dielectric layer 614 is used for implementing electrical isolation between adjacent devices. The interlayer dielectric layer 614 is further used for defining the size and position of the gate structure 800. A material of the interlayer dielectric layer 614 is an insulating material. In some implementations, the material of the interlayer dielectric layer 614 is silicon oxide. In other implementations, the material of the interlayer dielectric layer may also be another dielectric material such as silicon nitride or silicon oxynitride.

It should be further noted that, in some implementations, the gate structure 800 is formed using a high k last metal gate last process, and before the gate structure 800 is formed, a used dummy gate structure is of a laminate structure. Therefore, the semiconductor structure further includes: a gate oxide layer 710 located between the spacers 750 and the channel structure 650. During the process of removing the dummy gate structure to form the gate structure 800, the gate oxide layer 710 between the spacers 750 and the channel structure 650 is retained under the protection of the spacers 750.

In some implementations, a material of the gate oxide layer 710 is silicon oxide. In other implementations, the material of the gate oxide layer may also be silicon oxynitride. In other implementations, when the dummy gate structure is of a single-layer structure, the semiconductor structure may not include the gate oxide layer.

The semiconductor structure in some implementations can be formed using the forming method in the foregoing implementations, and may also be formed by using other forming methods. For the specific description about the semiconductor structure in the present implementations, reference can be made to the corresponding description in the foregoing implementations. Details are not described herein again.

Although the present disclosure is disclosed above, the present disclosure is not limited thereto. Any person skilled in the art can make various changes and modifications without departing from the spirit and scope of the present disclosure. Therefore, the protection scope of the present disclosure should be subject to the scope defined by the claims.

What is claimed is:

1. A method for forming a semiconductor structure, comprising:
   providing a substrate, the substrate comprising a device unit area, wherein at least two fins are formed on the substrate of the device unit area, a channel structure layer is formed on the fins, the channel structure layer comprising a first channel structure layer located on at least one fin, a second channel structure layer located on at least one fin, and a third channel structure layer located on at least one fin, the first channel structure layer comprising multiple channel laminates, each channel laminate comprising a first sacrificial layer and a first channel layer located on the first sacrificial layer, the second channel structure layer is a second channel layer of a single-layer structure, and the third channel structure layer comprises a third channel layer, a second sacrificial layer located on the third channel layer, and a fourth channel layer located on the second sacrificial layer;
   forming a dummy gate structure across the channel structure layer of the device unit area, wherein the dummy gate structure covers a part of a top and a part of lateral sides of the channel structure layer;
   forming a source-drain doping layer in the channel structure layer on two sides of the dummy gate structure;
   after forming the source-drain doping layer, forming an interlayer dielectric layer on the substrate exposed by the dummy gate structure, wherein the interlayer dielectric layer covers lateral sides of the dummy gate structure; and
   after forming the interlayer dielectric layer, forming a gate structure at positions of the dummy gate structure, the first sacrificial layer, and the second sacrificial layer.

2. The method for forming a semiconductor structure according to claim 1, wherein:
   the device unit area comprises a first region and a second region, the first region is used for forming the first channel structure layer, and the second region is used for forming the second channel structure layer;
   a fin material layer is formed on the substrate; and
   providing a substrate comprises:
      sequentially forming multiple channel material laminates on the fin material layer of the first region, wherein each channel material laminate comprises a first sacrificial material layer and a first channel material layer located on the first sacrificial material layer;
      forming a second channel material layer on the fin material layer of the second region; and
      patterning the channel material laminates of the first region, the second channel material layer of the second region, and the fin material layer of the first region and the second region to form fins protruding from the surface of the substrate, wherein the remaining channel material laminates on the fin of the first region are used as the first channel structure layer, and the remaining second channel material layer on the fin of the second region is used as the second channel structure layer.

3. The method for forming a semiconductor structure according to claim 2, wherein after sequentially forming the multiple channel material laminates are on the fin material layer of the first region, forming the second channel material layer on the fin material layer of the second region; or
   after forming the second channel material layer on the fin material layer of the second region, sequentially forming the multiple channel material laminates on the fin material layer of the first region.

4. The method for forming a semiconductor structure according to claim 2, wherein:
   after forming the channel material laminates on the fin material layer of the first region, forming the second channel material layer on the fin material layer of the second region;
   the step of sequentially forming multiple channel material laminates on the fin material layer of the first region and forming a second channel material layer on the fin material layer of the second region comprises:
      forming the multiple channel material laminates on the fin material layer;
      forming a pattern layer covering the channel material laminates of the first region;
      removing the multiple channel material laminates of the second region using the pattern layer as a mask, to expose the fin material layer of the second region;
      after removing the multiple channel material laminates of the second region removing the pattern layer; and
      after removing the pattern layer, forming a second channel material layer on the fin material layer of the second region.

5. The method for forming a semiconductor structure according to claim 4, wherein the step of forming the second channel material layer on the fin material layer of the second region comprises:
   epitaxially growing an initial second channel material layer on the fin material layer of the second region using a selective epitaxy process, wherein the top of the initial second channel material layer is higher than the top of the channel material laminates of the first region; and
   after the selective epitaxy process, performing planarization treatment on the initial second channel material layer, so that the top of the remaining initial second channel material layer is flush with the channel material laminates, and the remaining initial second channel material layer after the planarization treatment is used as the second channel material layer.

6. The method for forming a semiconductor structure according to claim 1, wherein a material of the second sacrificial layer is the same as a material of the first sacrificial layer, and materials of the third channel layer and the fourth channel layer are the same as the material of the first channel layer.

7. The method for forming a semiconductor structure according to claim 1, wherein:
   after forming the dummy gate structure across the channel structure layer of the device unit area and before the forming the source-drain doping layer in the channel structure layer on two sides of the dummy gate structure, the method further comprises:

etching the channel structure layer on two sides of the dummy gate structure, and forming, in the channel structure layer, grooves exposing the fins;

etching, along a direction perpendicular to a lateral side of the dummy gate structure, a part of the first sacrificial layers and a part of the second sacrificial layer that are exposed by the groove, so that the fin, the first channel layer adjacent to the fin and the remaining first sacrificial layer form a first trench, adjacent first channel layers and the remaining first sacrificial layer between the adjacent first channel layers form a second trench, and the third channel layer, the fourth channel layer and the remaining second sacrificial layer form a third trench; and forming barrier layers in the first trench, the second trench and the third trench; and the step of forming the source-drain doping layer in the channel structure layer on two sides of the dummy gate structure comprises: after forming the barrier layers, forming the source-drain doping layer in the grooves.

8. The method for forming a semiconductor structure according to claim 7, wherein in the step of forming the first trench, the second trench and the third trench, the part of the first sacrificial layer and the part of the second sacrificial layer that are exposed by the groove are etched along the direction perpendicular to the lateral side of the dummy gate structure by using a wet etch process.

9. The method for forming a semiconductor structure according to claim 7, wherein a material of the barrier layer is silicon nitride, silicon oxynitride, silicon oxide, a low k dielectric material or a super-low k dielectric material.

10. The method for forming a semiconductor structure according to claim 7, wherein a process of forming the barrier layers comprises an atomic layer deposition process or a chemical vapor deposition process.

11. The method for forming a semiconductor structure according to claim 1, wherein:

a material of the first sacrificial layer is SiGe, a material of the first channel layer and the second channel layer is Si; or a material of the first sacrificial layer is Si, and a material of the first channel layer and the second channel layer is SiGe.

12. A semiconductor structure, comprising:

a substrate, wherein the substrate comprises a device unit area, and at least two fins are formed on the substrate of the device unit area;

a channel structure located on the fins, wherein the channel structure comprises a first channel structure located on at least one fin and a second channel structure located on at least one fin, the first channel structure is spaced apart from the fin and comprises multiple first channel layers spaced apart, and the second channel structure is a second channel layer of a single-layer structure;

a gate structure across the channel structure, wherein the gate structure covers a part of a top and a part of lateral sides of the channel structure and surrounds the first channel layer; and a source-drain doping layer on two sides of the gate structure;

wherein the device unit area comprises a first region and a second region, the first channel structure is located on a fin of the first region, and the second channel structure is located on a fin of the second region, and the quantity of fins of the device unit area is greater than or equal to three, and along an extension direction of the fins, the first region is located on two sides of the device unit area, and the second region is located between adjacent first regions.

13. The semiconductor structure according to claim 12, wherein the channel structure further comprises a third channel structure located on at least one fin, the third channel structure layer comprises a third channel layer located on the fin and a fourth channel layer which is located above the third channel layer and spaced apart from the third channel layer; and the gate structure further surrounds the fourth channel layer.

14. The semiconductor structure according to claim 13, wherein a material of the third channel layer and a material of the fourth channel layer are the same as a material of the first channel layer.

15. The semiconductor structure according to claim 13, wherein:

the gate structure located between the fin and the first channel layer adjacent to the fin is a first gate structure part, the gate structure located between the adjacent first channel layers is a second gate structure part, the gate structure located between the third channel layer and the fourth channel layer is a third gate structure part, along a direction perpendicular to a lateral side of the gate structure, two sides of the first gate structure part and two sides of the second gate structure part expose a part of the first channel layer, and two sides of the third gate structure part expose a part of the third channel layer and a part of the fourth channel layer; and the semiconductor structure further comprises: barrier layers located on lateral sides of the first gate structure part, the second gate structure part and the third gate structure part, the barrier layers further cover the surface of the first channel layer that is exposed by the first gate structure part and the second gate structure part, as well as the surface of the third channel layer and the surface of the fourth channel layer that are exposed by the third gate structure part.

16. The semiconductor structure according to claim 15, wherein a material of the barrier layer is silicon nitride, silicon oxynitride, silicon oxide, a low k dielectric material or a super-low k dielectric material.

17. The semiconductor structure according to claim 12, wherein a material of the first channel layer is Si or SiGe, a material of the second channel layer is Si or SiGe, and the material of the first channel layer is the same as the material of the second channel layer.

\* \* \* \* \*